United States Patent
Mathai et al.

(10) Patent No.: US 9,164,249 B2
(45) Date of Patent: Oct. 20, 2015

(54) GLASS-SILICON WAFER-STACKED OPTO-ELECTRONIC PLATFORMS

(75) Inventors: Sagi Varghese Mathai, Berkeley, CA (US); Michael Renne Ty Tan, Menlo Park, CA (US); Wayne Victor Sorin, Mountain View, CA (US); Paul Kessler Rosenberg, Sunnyvale, CA (US); Georgios Panotopoulos, Berkeley, CA (US); Susant K Patra, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/365,129

(22) PCT Filed: Jan. 27, 2012

(86) PCT No.: PCT/US2012/022844
§ 371 (c)(1),
(2), (4) Date: Jun. 13, 2014

(87) PCT Pub. No.: WO2013/112171
PCT Pub. Date: Aug. 1, 2013

(65) Prior Publication Data
US 2014/0341516 A1    Nov. 20, 2014

(51) Int. Cl.
*G02B 6/42* (2006.01)
*H01L 31/0232* (2014.01)

(52) U.S. Cl.
CPC .............. *G02B 6/423* (2013.01); *G02B 6/4204* (2013.01); *G02B 6/4212* (2013.01); *G02B 6/4249* (2013.01); *G02B 6/4259* (2013.01); *G02B 6/4279* (2013.01); *G02B 6/4292* (2013.01); *H01L 31/02325* (2013.01)

(58) Field of Classification Search
CPC ........... H01L 31/02325; G02B 6/4212; G02B 6/423; G02B 6/4228; G02B 6/4257
See application file for complete search history.

(56) References Cited

U.S. PATENT DOCUMENTS

| 5,994,204 | A  | 11/1999 | Young et al. |
| 6,328,482 | B1 | 12/2001 | Jian |
| 6,517,259 | B1 | 2/2003  | Murata |
| 6,527,455 | B2 | 3/2003  | Jian |

(Continued)

FOREIGN PATENT DOCUMENTS

EP    0562211 A1    9/1993

OTHER PUBLICATIONS

Brusberg, L. et al, Thin Glass Based Packaging Technologies for Optoelectronic Modules, 2009 Electronic Components and Technology Conference, 2009 IEEE, pp. 207-212.

(Continued)

*Primary Examiner* — Omar R Rojas
(74) *Attorney, Agent, or Firm* — Hewlett-Packard Patent Department

(57) ABSTRACT

A glass-silicon wafer stacked platform. The platform includes a plurality of silicon pillars defining a ferrule receptacle, a silicon spacer connected to bases of the pillars and enclosing an aperture, a glass wafer bonded to the spacer, a microlens array formed in a first surface of the glass wafer and located in the aperture, conductive material carried by a second surface of the glass wafer, and contacts in electrical communication with the conductive material.

15 Claims, 16 Drawing Sheets

(56) References Cited

U.S. PATENT DOCUMENTS

| | | | |
|---|---|---|---|
| 6,542,672 B2* | 4/2003 | Jewell et al. | 385/49 |
| 7,476,041 B2 | 1/2009 | Kopp et al. | |
| 7,720,337 B2* | 5/2010 | Lu et al. | 385/52 |
| 2003/0002809 A1 | 1/2003 | Jian | |
| 2004/0022487 A1 | 2/2004 | Nagasaka et al. | |
| 2006/0204182 A1 | 9/2006 | Murry | |
| 2008/0193142 A1 | 8/2008 | Kopp et al. | |
| 2010/0047588 A1 | 2/2010 | Hata et al. | |

OTHER PUBLICATIONS

International Search Report & Written Opinion, Sep. 25, 2012, PCT Patent Application No. PCT/US2012/022844, 8 pages.

Larsen, K.P. et al, SOI Silicon on Glass for Optical MEMS, Transducers '03, The 12th International Conference on Solid State Sensors, Actuators and Microsystems, Boston, Jun. 8-12, 2003, pp. 1655-1658.

Extended European Search Report received in EP Application No. 12866666.6, Jul. 28, 2015, 4 pages.

\* cited by examiner

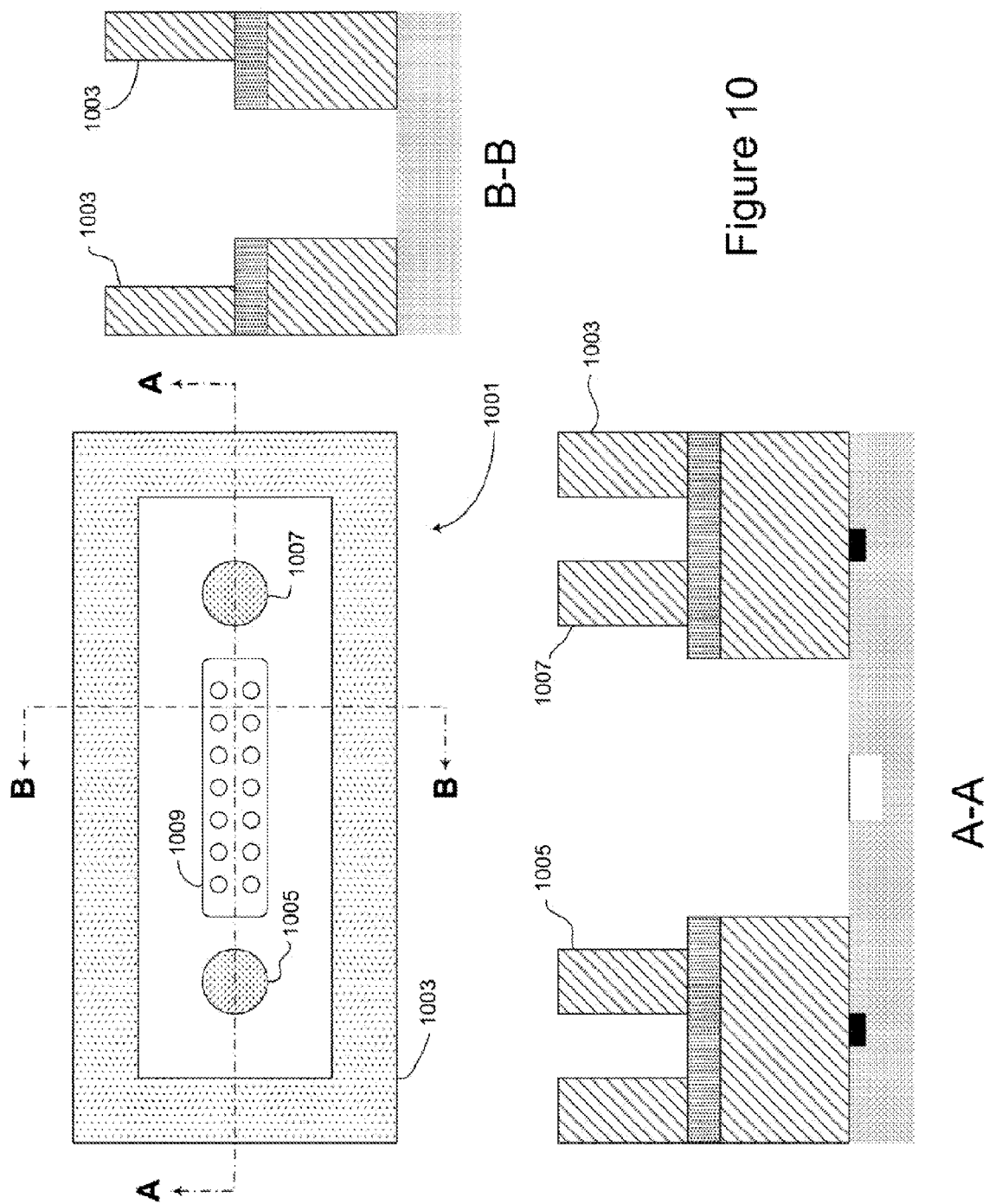

GLASS-SILICON WAFER-STACKED OPTO-ELECTRONIC PLATFORMS

BACKGROUND

Optical fibers can carry so much more data than copper wires or other signal-carrying devices that they are coming into more widespread use within individual electronic appliances such as desktop computers as well as in loner-distance communication lines. In addition to the fiber itself, an optical fiber communication system includes opto-electronic components at each end of the fiber to convert between optical signals and electronic signals. For example, a transmitter that provides optical signals to a fiber may comprise a light-emitting diode (LED) or a laser diode such as a vertical-cavity surface-emitting laser (VCSEL) or edge emitting laser. A receiver that receives optical signals from a fiber may comprise a photodetector such as a semiconductor photodiode. An opto-electronic platform is a mechanical coupler that ensures efficient optical communication between an optical fiber and an opto-electronic component. An opto-electronic platform in combination with an opto-electronic component may be referred to as an opto-electronic engine. Efficient coupling of a fiber to a component requires precise alignment of the fiber with the component. Opto-electronic engines commonly require active alignment of the fiber and the component. Other opto-electronic engines employ high-precision molded parts. Pairs of MT-ferrule guide pins are commonly used to mate an opto-electronic engine to a corresponding MT ferrule carried by the optical fiber.

BRIEF DESCRIPTION OF THE DRAWINGS

The drawings illustrate principles of the invention by example. The drawings are not to scale.

FIG. 10 is a top view with two cross-sections of a glass-silicon wafer-stacked opto-electronic platform according to an example.

DETAILED DESCRIPTION

Figures 1, 2:
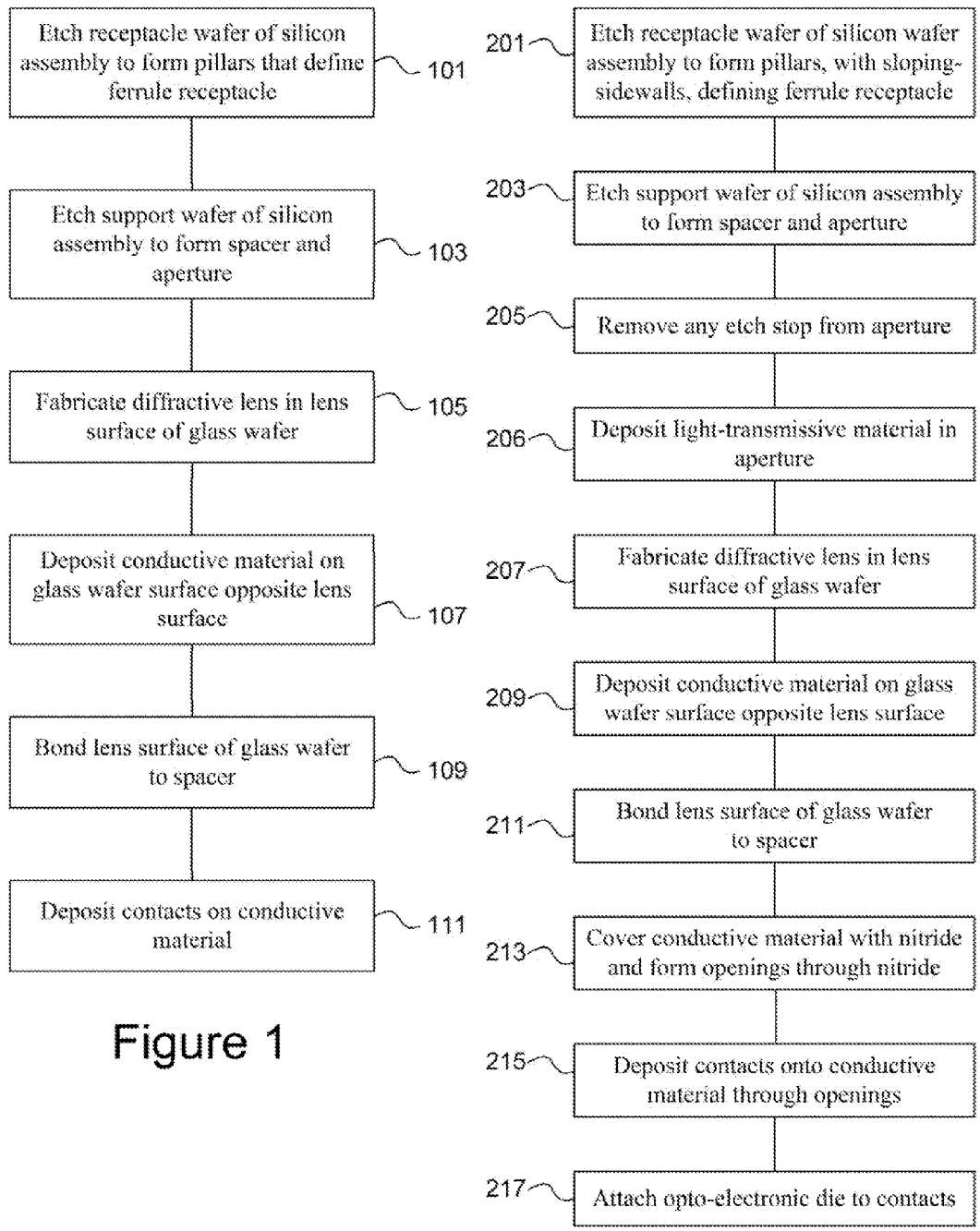
FIGS. 1-5 are flowcharts depicting methods of fabricating glass-silicon wafer-stacked opto-electronic platforms according to various examples.

In the drawings and in this description, examples and details are used to illustrate principles of the invention. Other configurations may suggest themselves. Parameters such as voltages, temperatures, dimensions, and component values are approximate. Terms of orientation such as up, down, top, and bottom are used only for convenience to indicate spatial relationships of components with respect to each other, and except as otherwise indicated, orientation with respect to external axes is not critical. Some known methods and structures have not been described in detail in order to avoid obscuring the invention. Methods defined by the claims may comprise steps in addition to those listed, and except as indicated in the claims themselves the steps may be performed in another order than that given. Accordingly, the invention may be practiced without limitation to the details and arrangements as described. The invention is to be limited only by the claims, not by the drawings or this description.

Cost is a major source of concern when applying optoelectronic engines in computer communication applications. Much of the cost results from the need to actively align lenses and fibers with their associated opto-electronic components and from the use of high-precision components. There is a need for a less expensive way to efficiently couple optical fibers with opto-electronic components.

FIG. 1 depicts a method of fabricating a glass-silicon wafer stacked platform according to an example. A receptacle wafer of a silicon wafer assembly is etched (101) to lot n a plurality of pillars that define a ferrule receptacle. The ferrule receptacle is designed to mate with a ferrule incorporating optical transmission media such as an optical fiber array. A support wafer of the silicon wafer assembly is etched (103) to form one or more spacers and apertures. A single spacer may partially or fully enclose the apertures, or a plurality of spacers may be disposed around the apertures. The spacers and apertures are precisely aligned using photolithography. One or more microlenses, such as diffractive and refractive microlenses, are fabricated (105) on a lens surface of a glass water. The microlenses may extend into the glass wafer below the surface. Conductive material is deposited and patterned (107) on a surface of the glass wafer opposite the lens surface. The conductive material may include, but is not limited to, metal traces and metal pads. The conductive material is precisely aligned to the microlenses using front to back alignment techniques. The lens surface of the glass wafer is aligned and bonded (109) to the surface of the silicon wafer assembly opposite the pillars. The microlenses are precisely aligned to the apertures to optimally couple the microlenses to optical transmission media mated to the ferrule receptacle. Contacts are deposited (111) on the conductive material; some examples of contacts include under bump metals, solder bumps, and copper pillars. These contacts are precisely aligned or self-aligned to the conductive material, and therefore to the microlenses. An optoelectronic die is attached to the contacts using self-aligned solder reflow. The thickness of the spacer, glass wafer, and contacts are selected for optimal coupling of the optoelectronic die to the optical transmission media for a particular application. In some examples the apertures are filled with a light-transmissive (transparent or partly transparent) material such as but not limited to epoxy and plastic, to seal the aperture.

Another example is shown in FIG. 2. A receptacle wafer of as silicon wafer assembly is etched (201) to form a plurality of pillars that define a ferrule receptacle. One or more of the pillars may be formed with sloping sidewalls rather than vertical sidewalls to facilitate mating with as ferrule such as an MT ferrule. In some examples the sidewalls may be chamfered, rounded, or shaped in some other suitable way. A support water of the silicon wafer assembly is etched (203) to form one or more spacers and apertures. The silicon wafer assembly may comprise two silicon wafers with an etch stop layer in between. The two wafers may be identical, but one is used to form the pillars and the other is used to form the spacers and apertures. More than one spacer may be formed with the aperture defined between them, or a single annular spacer that partially or totally encloses the aperture may be used. In some examples the etch stop in the aperture is removed (205). In other examples, a light-transmissive etch stop may be used and does not have to be removed. In some examples the etch stop layer is used to seal the aperture. In some examples a light-transtmissive material is deposited (206) in the aperture. One or more microlenses are fabricated (207) on a lens surface of a glass wafer. Conductive material is deposited (209) on as surface of the glass wafer opposite the lens surface. Etching of the silicon, and fabricating the lens and depositing the conductive material, are independent processes and may be carried out in any order as convenient. The lens surface of the glass wafer is aligned and wafer bonded (211) to the surface of the silicon wafer assembly opposite the pillars. This can help to provide adequate alignment between the microlenses and pillars to provide efficient coupling between, for example, an MT ferrule mated to the pillar side of the silicon wafer and the microlenses. The conductive material may be patterned to define one or more conductors. The conductive material may be covered (213) with non-conductive dielectric material, such as silicon nitride, silicon dioxide, polyimide, etc., and openings exposing parts of the conductive material may be formed through the non-conductive dielectric material. Contacts, which may comprise under bump metals and solder bumps, are deposited (215) on the conductive material, for example through the openings in the non-conductive dielectric. All of the fabrication steps described above are performed at the wafer scale. One or more optoelectronic dies, for example as photodetector for receiving an optical signal from an optical fiber or a VCSEL for providing an optical signal for transmission through an optical fiber, may be attached to the contacts. The optoelectronic dies may be singlets or one-dimensional (1D) or 2D arrays of optoelectronic devices. This attachment may be carried out, for example, by flip-chip solder mourning and self-aligned reflow at the water scale.

Figure 3:
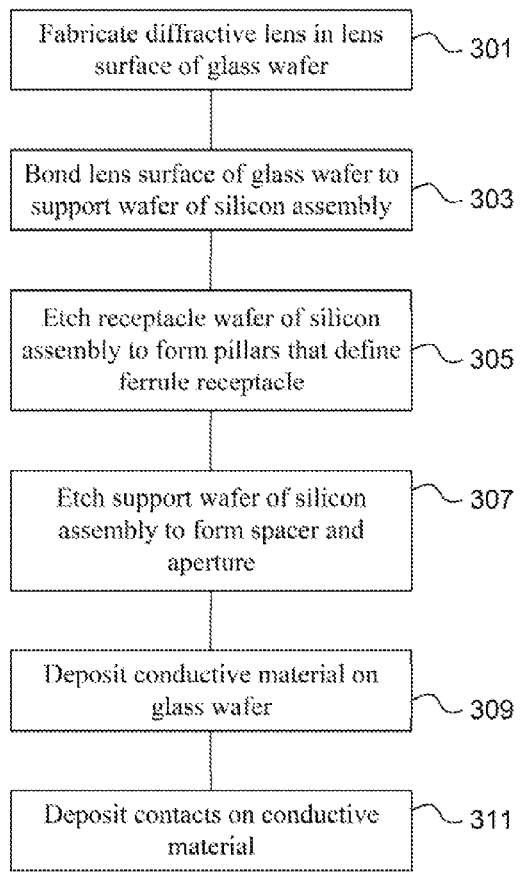
Figure 4:
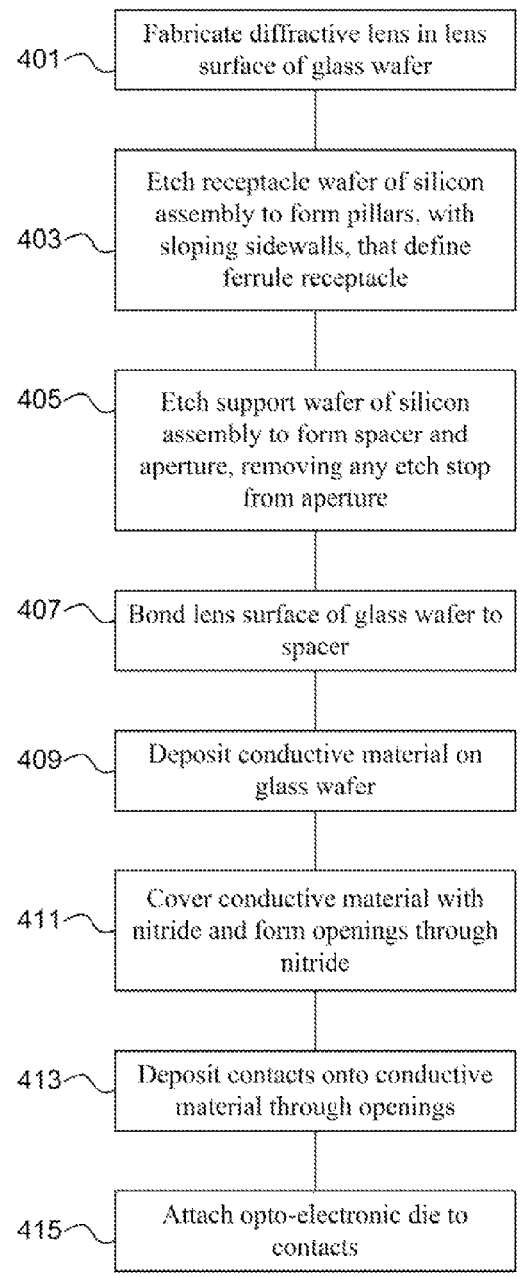
Figure 5:
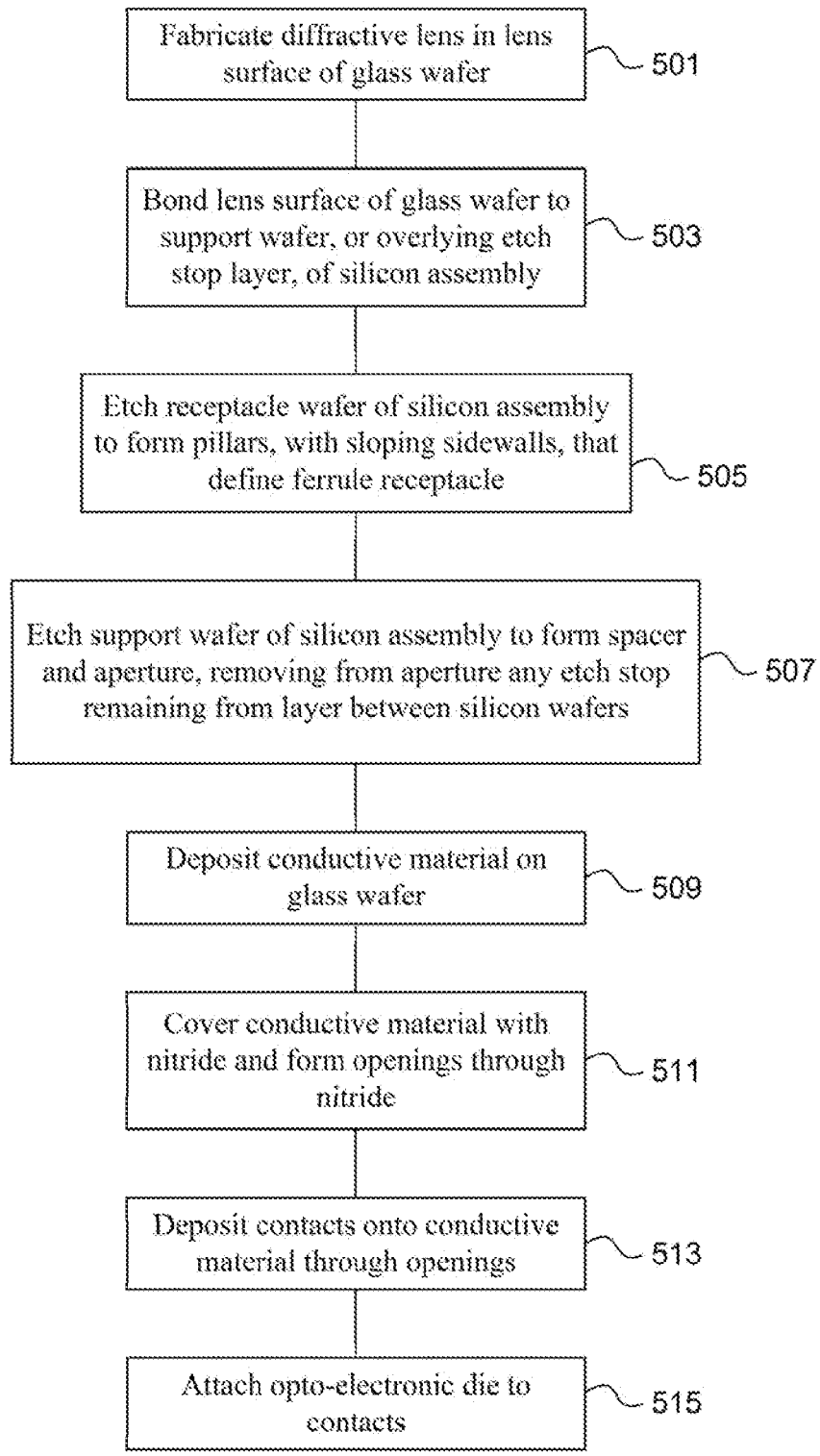

FIGS. 3-5 show examples in which the glass is bonded to the silicon prior to completion of processing of the silicon and glass waters. Referring to FIG. 3, such an example includes fabricating (301) one or more microlenses on a lens surface of a glass wafer. The microlenses may be diffractive lenses etched into the glass wafer or a refractive recessed from the surface of the glass wafer. The lens surface is wafer bonded (303) to a support wafer of a silicon wafer assembly. A receptacle wafer of the silicon water assembly is etched (305) to form as plurality of pillars that are aligned to the microlenses to define a ferrule receptacle. The support wafer of the silicon wafer assembly is etched (307) to form one or inure spacers and apertures for the microlenses. Conductive material is deposited (309) on the glass wafer, and contacts are deposited (311) on the conductive material. The optoelectronic dies are attached to the conductive material by flip chip self-aligned solder reflow.

Turning now to FIG. 4, an example in which the silicon wafer assembly is etched prior to bonding with the glass wafer, but processing of the glass wafer takes place after bonding, is illustrated. One or more microlenses are fabricated (401) in a lens surface of the glass wafer. A receptacle wafer of the silicon assembly is etched (403) to form a plurality of pillars that define a ferrule receptacle. Some or all of the pillars may have sloping sidewalls. A support wafer of the silicon assembly is etched (405) to form one or more spacers and apertures. Any etch stop remaining in the aperture is removed. The lens surface of the glass wafer is aligned and wafer bonded (407) to the silicon wafer on the side opposite the pillars, which as in a previous example may comprise for example more than one spacer, or a spacer that encircles the aperture. Conductive material is deposited (409) on the glass wafer. The conductive material may be covered (411) with silicon nitride or other non-conducting dielectric material having openings extending to the conductive material. Contacts are deposited (413) on the conductive material through the openings. An optoelectronic die may be attached (415) to the contacts.

FIG. 5 illustrates an example in which the glass and silicon wafers are bonded before either is proceed. As some of the previous examples, so this example is fabricated from a silicon wafer assembly comprising a support wafer and a receptacle wafer with an etch stop layer between. In this example the wafer assembly may also have a second etch stop layer overlying the support wafer. The method begins with fabricating (501) one or more diffractive lenses in a lens surface of the glass wafer. The glass wafer, specifically its lens surface, is aligned and wafer bonded (503) to the support wafer of the silicon wafer assembly. If the wafer assembly has a second etch stop layer, the glass may be bonded to that layer rather than to the silicon support wafer beneath it. For example, the etch stop layer may be a thin film of silicon dioxide and the glass wafer can be bonded to silicon dioxide. The receptacle wafer of the silicon wafer assembly is etched (505) to form a plurality of pillars that define a ferrule receptacle. These pillars are precisely aligned to the lenses using photolithography. On or more of the pillars may be formed with sloping rather than vertical sidewalls. The support wafer is etched (507) to form one or more spacers and apertures that are precisely aligned to the pillars and lenses using photolithography. Any etch stop from the layer between the support and receptacle wafers, is removed from the apertures, but in some examples any of the second etch stop layer that overlies the support wafer is not removed. Conductive material is deposited (509) on the glass wafer. As in some other examples, the conductive material may be patterned to define metal traces and pads, and covered (511) with silicon nitride or other non-conducting material. Openings may be formed through the silicon nitride to the conductors below. Contacts are deposited (513) on the conductive material, for example, through the openings in the silicon nitride or directly if silicon nitride is not present. An optoelectronic die such as a VCSEL or photodiode may be attached to the contacts, for example by soldering.

Methods of fabrication according to examples such as those describe above include passive alignment of the various components at the wafer level, thereby eliminating any need for active alignment. The resulting glass-silicon wafer-stacked platform may be used as a building block to construct passively aligned one-dimensional and two-dimensional optoelectronic engines, for example by attaching optoelectronic dies. Diffractive or refractive micro-lenses, electrical conductors (traces and pads), and contacts winch may be in the form of solder bumps are fabricated on the glass wafer. The silicon is patterned with thou-wafer apertures and silicon pillars for passive fiber attachment. High alignment accuracy (<1 micron) between the patterned features can be achieved with conventional stepper-based photolithograph). The two wafers are integrated by wafer bonding, again with high alignment accuracy (<5 micron). The three-dimensional wafer-stacked platform is ready for flip chip mounting of optoelectronic dies and subsequent integration into a larger opto-mechanical package with heat sinks, printed circuit boards, integrated circuits, and the like. This packaging technique may be used to build arrays of transmitters, receivers, and transceivers.

Microlenses may be etched into or formed on the lens surface of the glass wafer by step-and-repeat photolithography, imprint lithography, molding, reflow, or etching. Metal traces, pads, and under-bump metallization are patterned on the opposite surface of the glass wafer by, for example, conventional front-to-back alignment techniques. Meanwhile the silicon wafer assembly is patterned with one or more apertures, a spacer layer, and silicon mechanical alignment pillars using cons cotton silicon micro electromechanical system (MEMS) fabrication techniques. The glass and silicon are bonded at any of several stages during their respective fabrication, as described above, using standard wafer bonding took. After bonding, the wafer-stacked platform is solder bumped, VCSEL/PD dies may be flip-chip attached and reflowed at the wafer level. In some examples many platforms are fabricated on one glass wafer and one silicon assembly, and in these examples the platforms are diced into individual sub-mounts which may then be integrated into a larger package as described above.

Figure 6A:
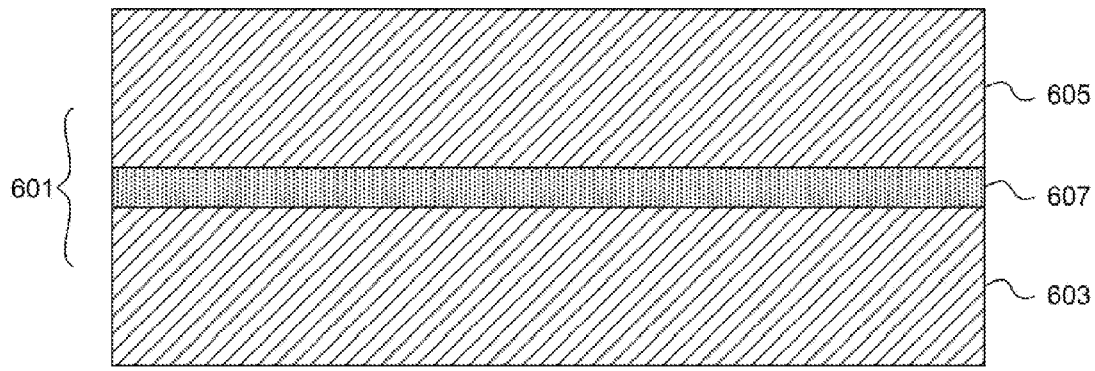
FIGS. 6A, 6B, 6D-6H, and 6J-6L are sectional views.
Figure 6B:
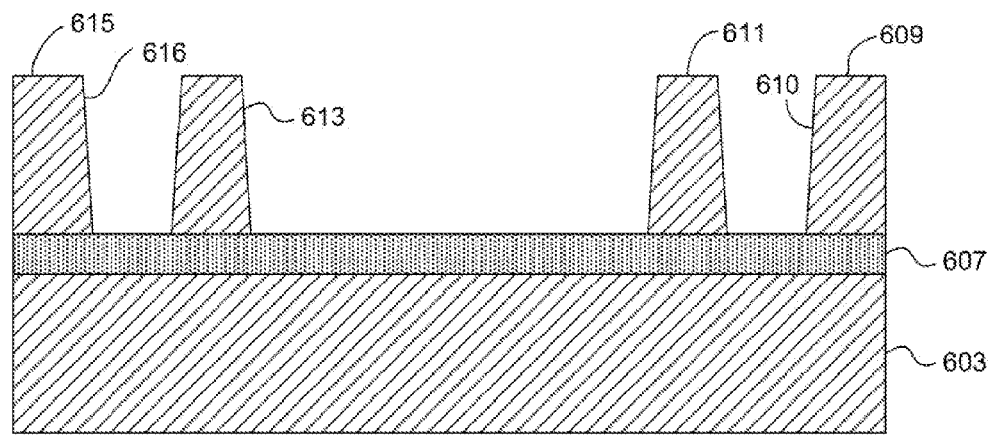
Figure 6C:
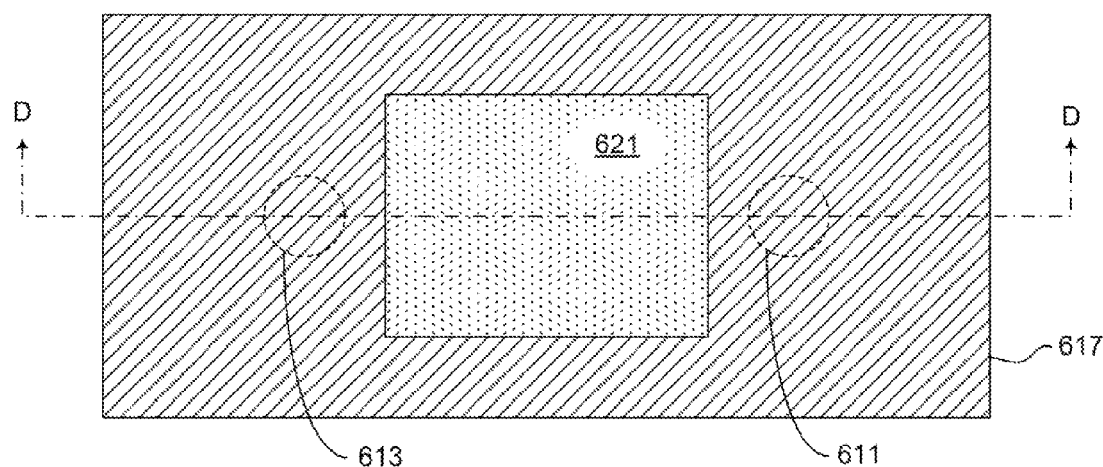
FIG. 6C is a bottom view, of stages in fabricating a glass-silicon wafer-stacked opto-electronic platform according to an example.
Figure 6D:
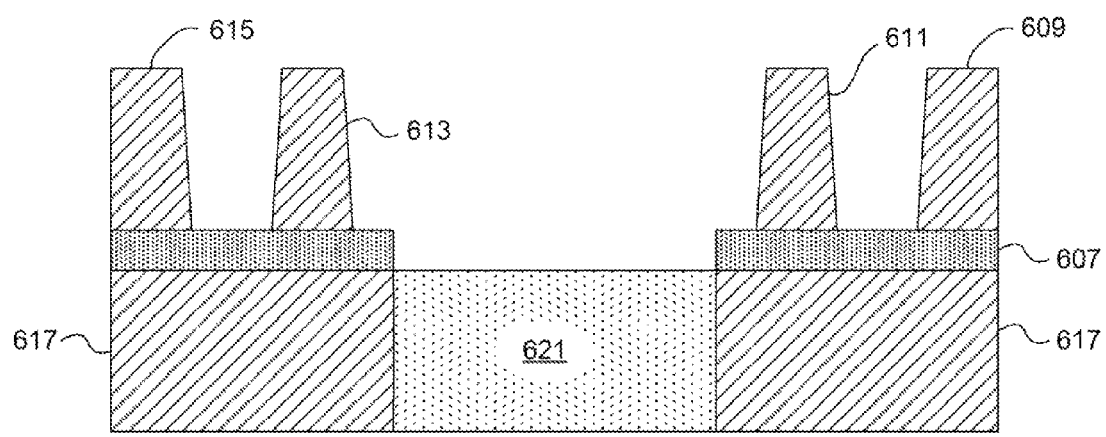

FIGS. 6A-6H and 6J-6L illustrate successive stages in fabricating a glass-silicon wafer-stacked optoelectronic platform according to in example. A silicon wafer assembly generally 601 comprises a support wafer 603, a receptacle wafer 605, and an etch stop layer 607 therebetween. In FIG. 6B the receptacle water has been etched, using for example deep reactive ion etching, to define pillars 611 and 613 and walls 609 and 615. In this example the pillars 611 and 613 have been formed with sloping sidewalls, and interior-facing surfaces 610 and 616 of the walls 609 and 615, respectively, have also been formed with sloping sidewalk. FIG. 6C shows a bottom view of the wafers after the support wafer has been etched to form a spacer 617 and an aperture 621. The aperture is precisely aligned to the pillars using conventional photolithography. In this example a single spacer 617 surrounds the aperture 621. In other examples there may be more than one aperture and one or more spacers around the apertures.

Figure 6E:
Figure 6F:
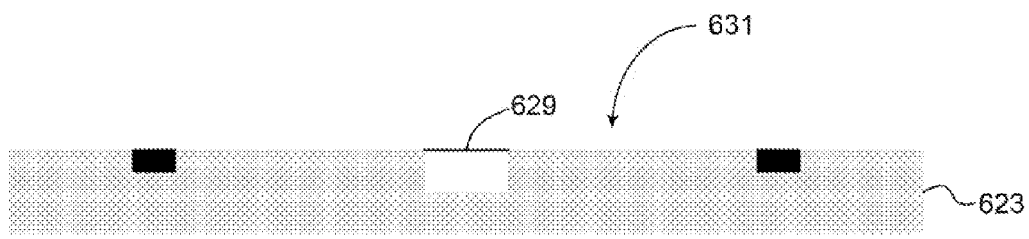
Figure 6G:
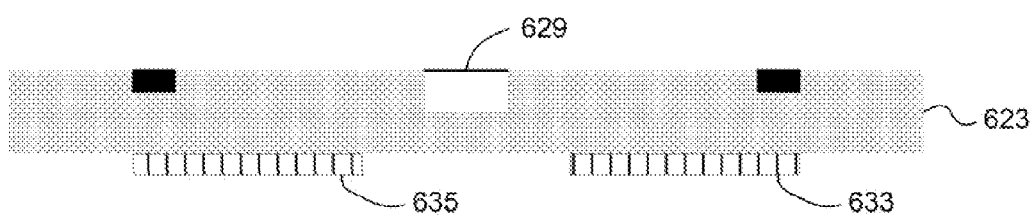
Figure 6H:
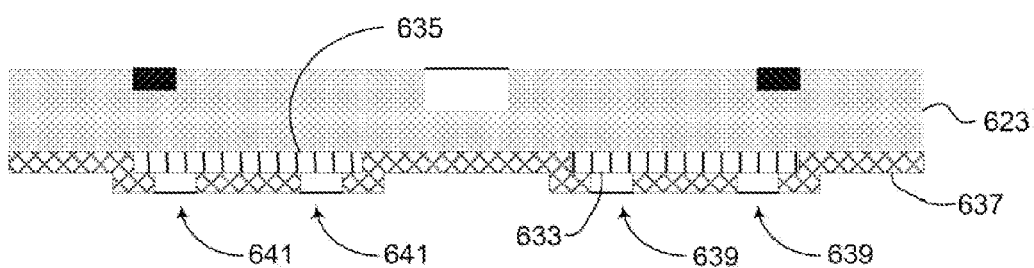

A glass wafer 623 with alignment marks 625 and 627 is shown in FIG. 6E. A diffractive lens 629 has been etched in a lens surface 631 in FIG. 6F. Alternatively, the diffractive lens may be formed in a layer of material deposited on top of the glass surface. The lens is precisely aligned to the alignment marks. FIG. 6G shows the deposit of conductive material; in this example the conductive material has been patterned as conductors 633 and 635 are precisely aligned to the alignment marks and therefore the lens. In FIG. 6G, silicon nitride 637 has been deposited over the conductors and openings 639 and 641 have been formed in the silicon nitride to access the conductors 633 and 635, respectively.

Figure 6J:
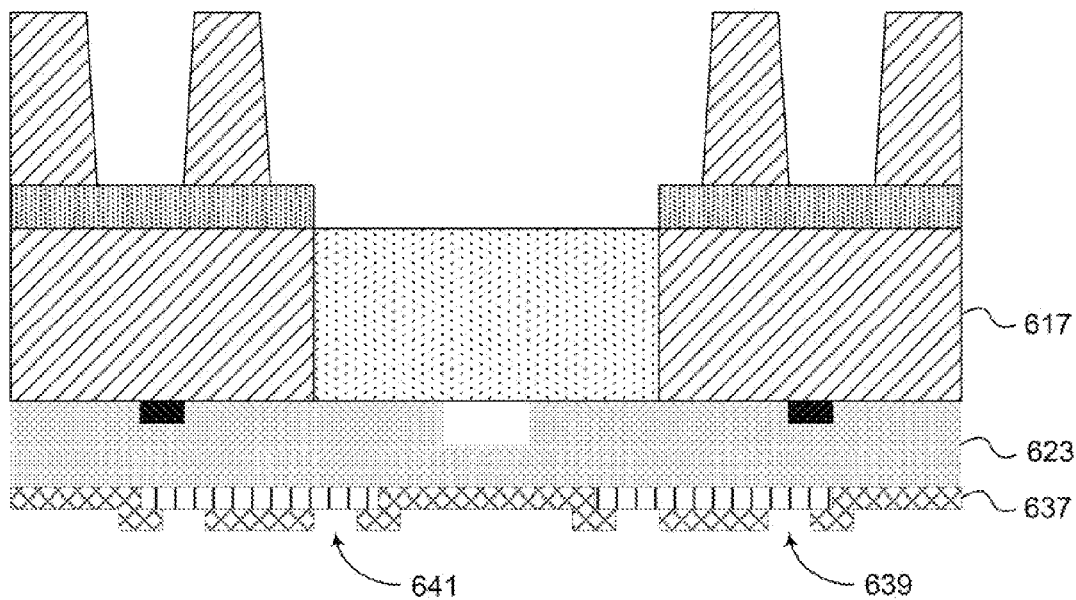
Figure 6K:
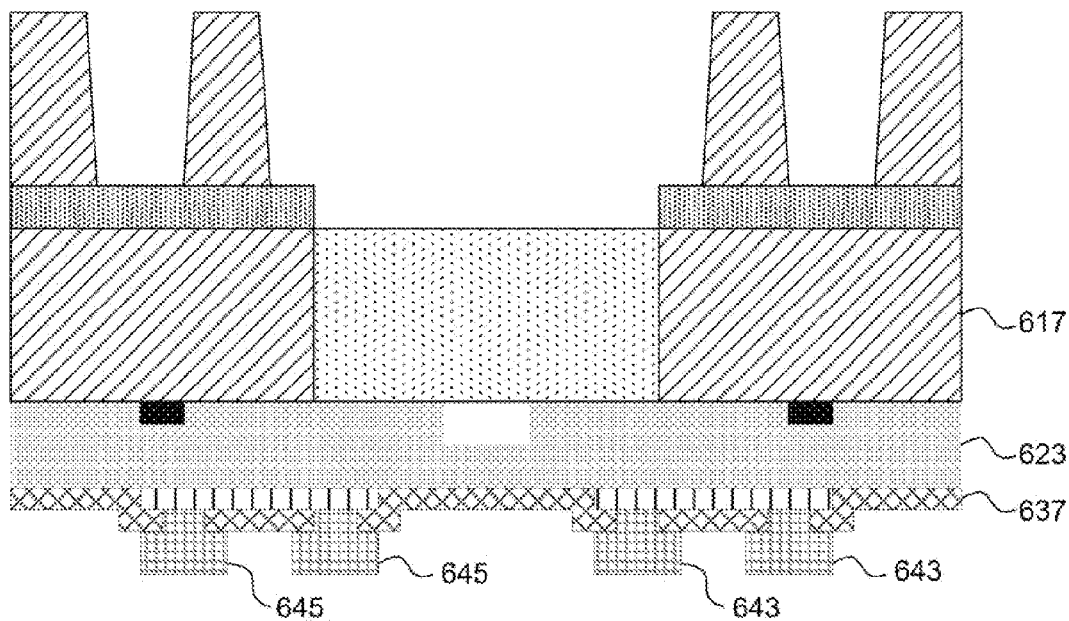
Figure 6L:
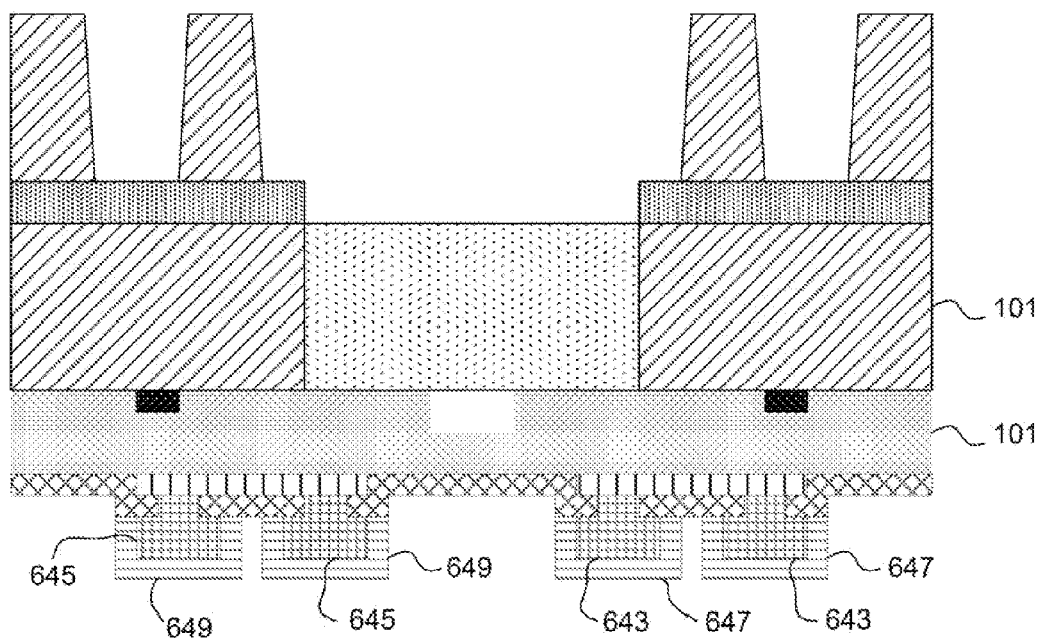

FIG. 6J shows the platform after aligned wafer bonding of the glass and silicon wafers. The wafers are aligned such that the lens is precisely aligned to the pillars. In FIG. 6K, contacts 643 and 64 have been placed in the openings 639 and 641, respectively, to establish electrical communication with the conductors 633 and 635. These contacts can be self-aligned to the silicon nitride vias by electrolytic metal deposition and therefore are self-aligned to the microlenses. Finally, FIG. 6L shows the completed platform with additional conductive materials 647 and 649 covering the contacts 643 and 645, respectively. These conductive materials may be composed of under bump metals, for example nickel and gold, and solder, such as SAC305 or AuSn.

Figure 7A:
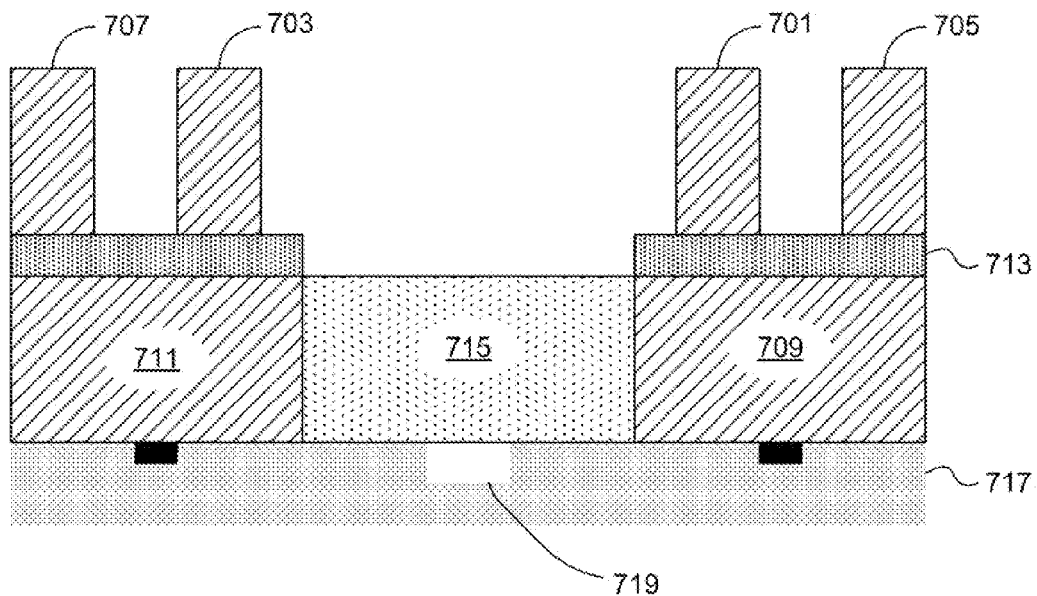
FIGS. 7A-7D are sectional views of stages in fabricating a glass-silicon wafer-stacked opto-electronic platform according to another example.

FIGS. 7A-7D illustrate successive stages in fabricating a glass-silicon wafer-stacked opto-electronic platform according to another example. In FIG. 7A, a silicon wafer assembly has been etched as described above, forming pillars 701 and 703, walk 705 and 707, and supports 709 and 711. In this example the pillars and walk 701, 703, 705, and 707 have vertical sidewalls rather than sloping sidewalls. An etch stop layer 713 lies between the pillar 701 and wall 705, and the support 709, and an etch stop layer 714 lies between the pillar 703 and the wall 707, and the support 711. An aperture 715 is defined between the supports 709 and 711. A glass wafer 717 has been aligned and wafer bonded to the supports. A diffractive lens 719 has been formed in the glass wafer.

Figure 7B:
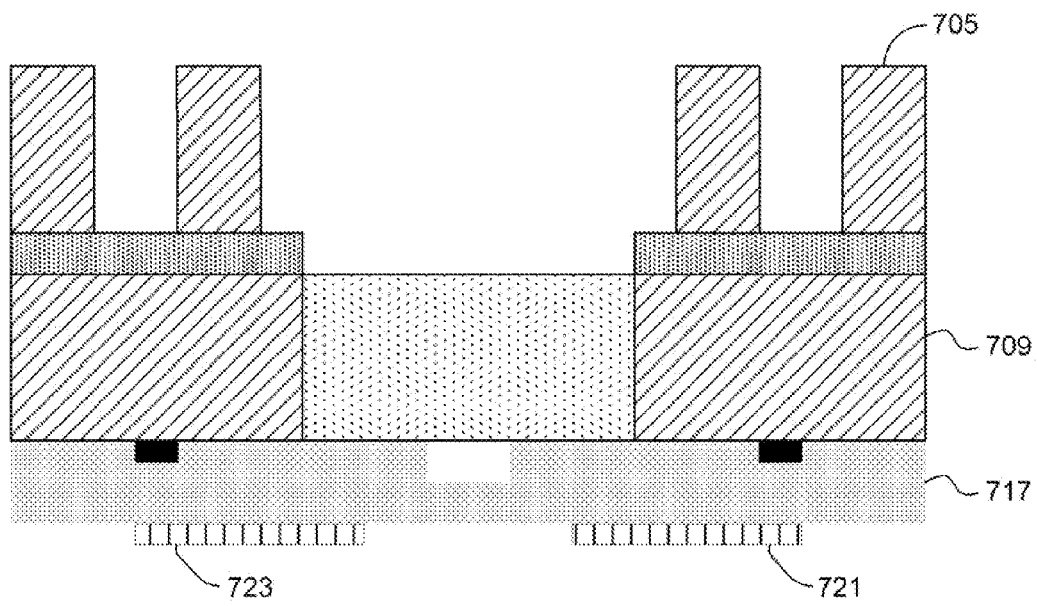
Figure 7C:
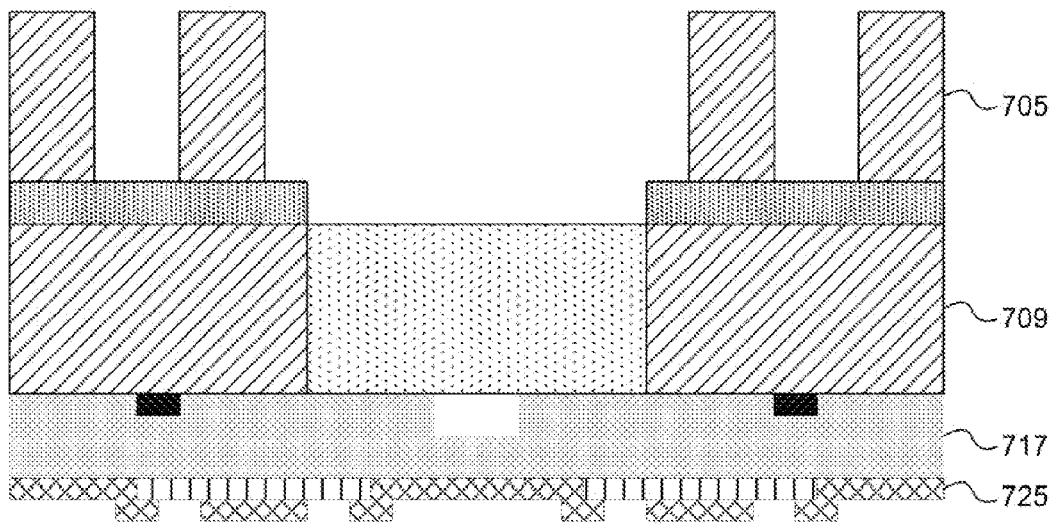
Figure 7D:
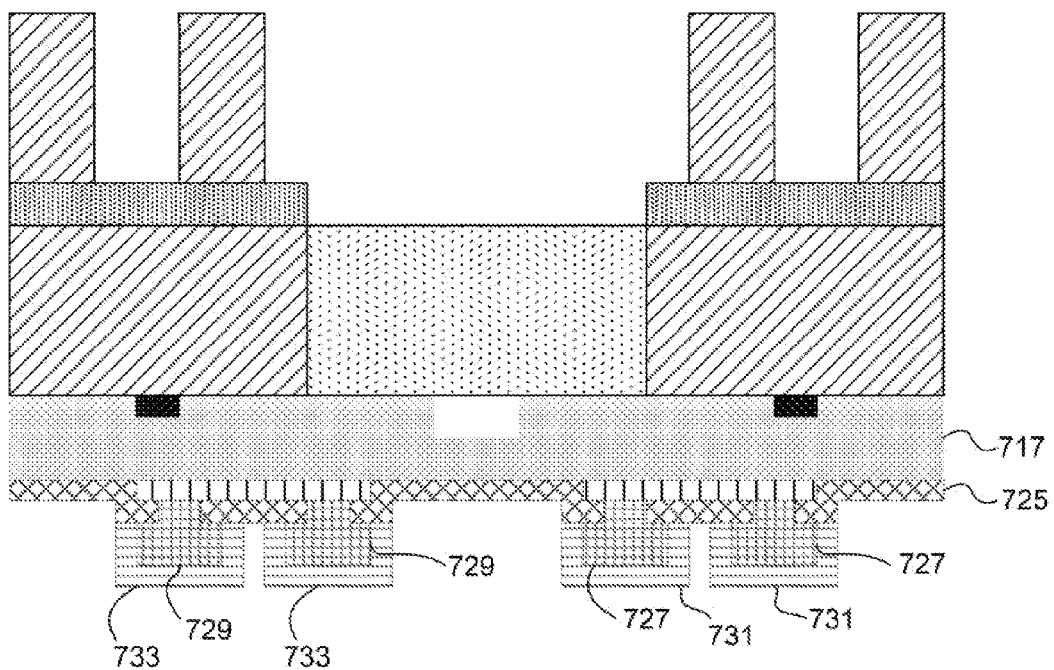

In FIG. 7B conductive material has been deposited on the glass water on a surface opposite the diffractive lens, forming conductors 721 and 723. The conductors are aligned to the lens. FIG. 7C shows a silicon nitride layer 725, similar to the silicon nitride layer 637, overlying the conductors 721 and 723. Contacts 727 and 729 and additional conductive material 731 and 733 have been added in FIG. 7D.

Figure 8A:
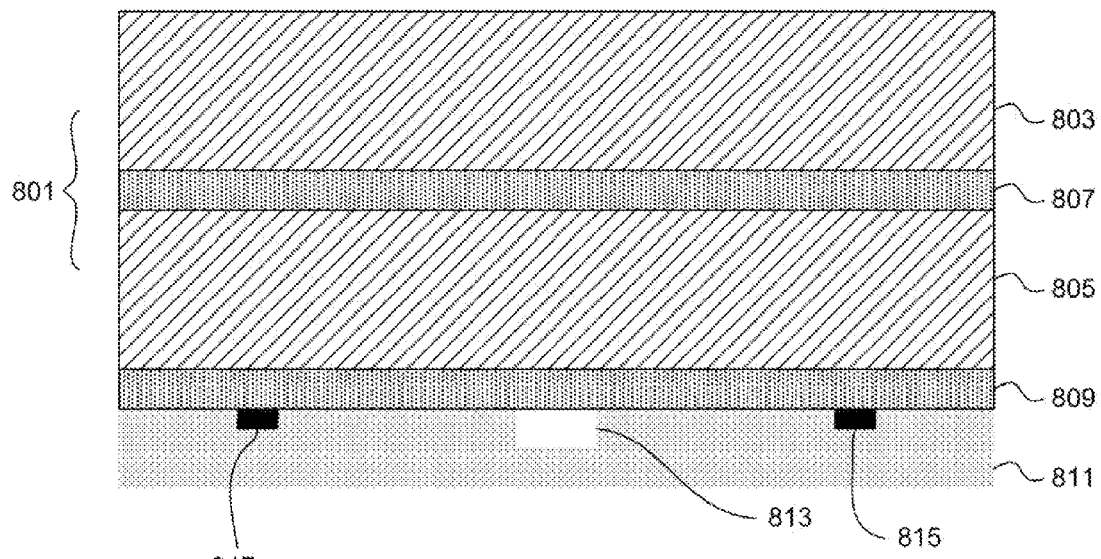
FIGS. 8A-8F are sectional views of stages in fabricating a glass-silicon wafer-stacked opto-electronic platform according to another example.

Another example is shown in FIGS. 8A-8F. In FIG. 8A, a silicon wafer assembly generally 801 has a receptacle wafer 803 and a support wafer 805 with as first etch stop layer 807 in between. A second etch stop layer 809 is disposed on the support wafer 805 opposite the first etch stop layer 807. A glass wafer 811 is wafer bonded to the silicon wafer assembly 801. The glass wafer has a diffractive lens 813 and reference marks 815 and 817.

Figure 8B:
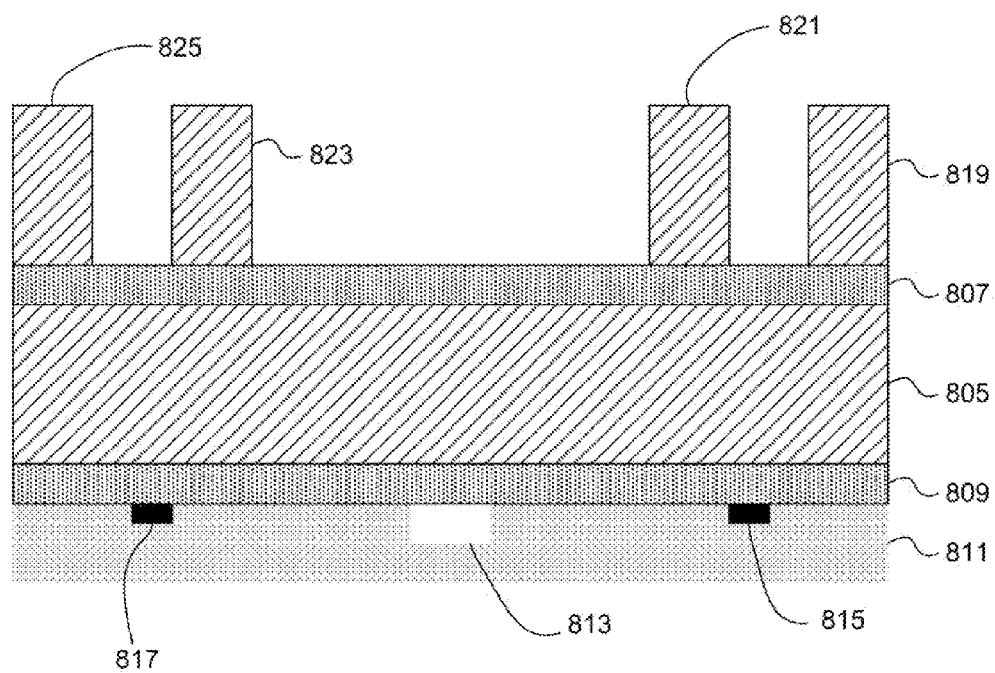

FIG. 8B shows etching of the receptacle wafer 803 to define pillars 821 and 823, and walls 819 and 825. The pillars and walls 819, 821, 823, and 825 are aligned with the reference marks 815 and 817. The lens 813 is generally centered between the pillars 821 and 823. In an alternate example, the pillars are chamfered or rounded at the top of the pillars.

Figure 8C:
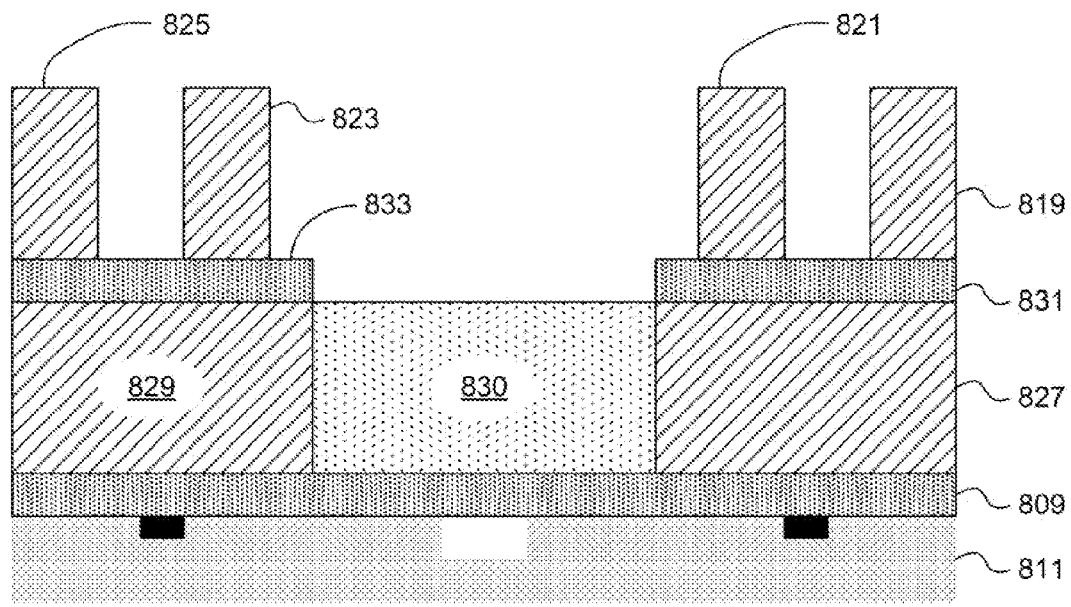

In FIG. 8C, the silicon assembly has been etched to form supports 827 and 829, defining an aperture 830. The support 827 is still separated from the pillar 819 and wall 821 by a remnant 831 of the first etch stop layer 807, and the support 829 is separated from the pillar 823 and wall 825 by another remnant 833 of the first etch stop layer. The second etch stop layer 809 remains in place.

Figure 8D:
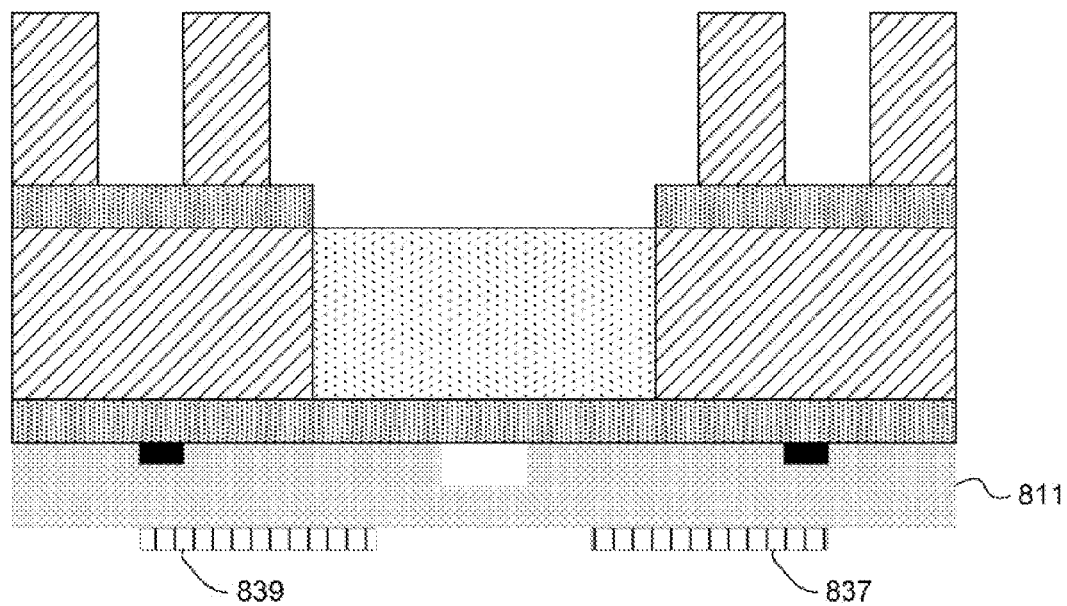
Figure 8E:
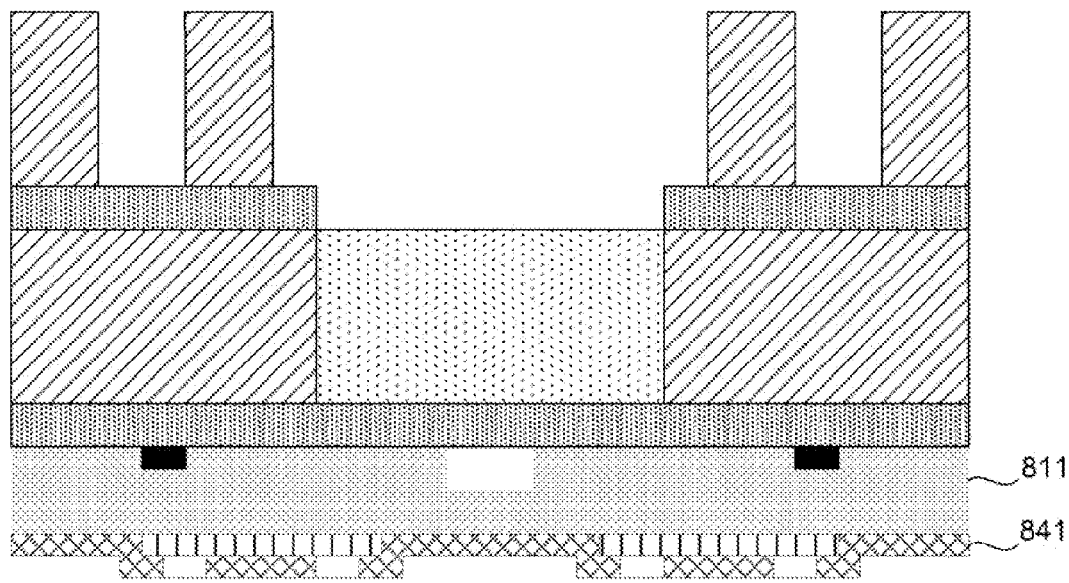
Figure 8F:
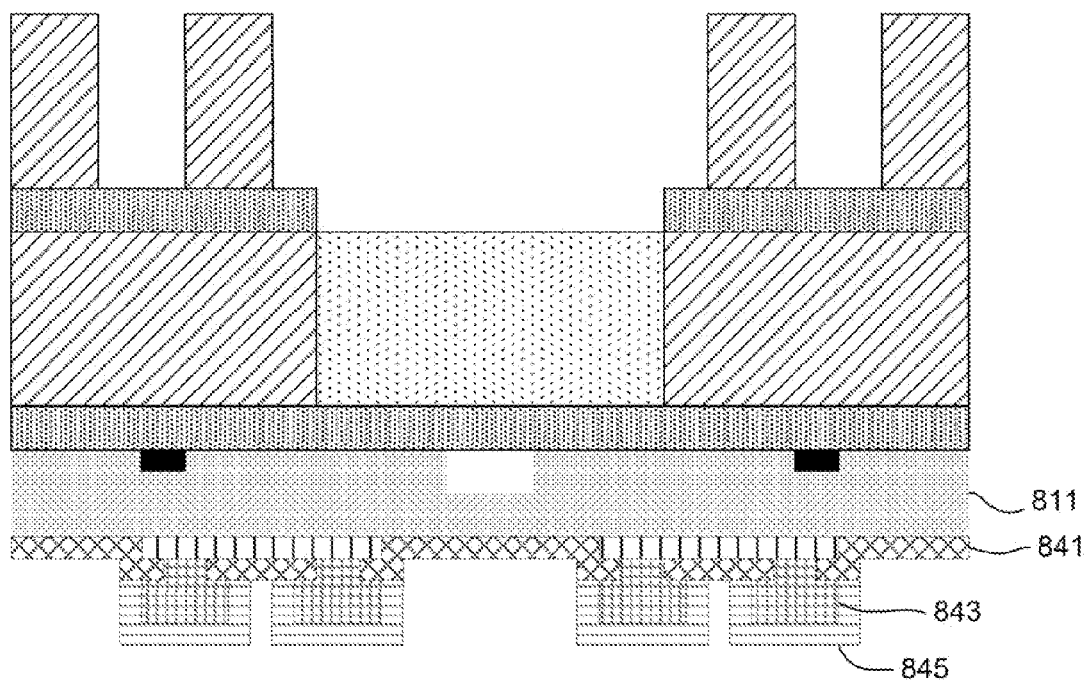

FIGS. 8D, 8E, and 8F show the deposit of conductive material 837 and 839 on the glass wafer 811, deposit of silicon nitride 841, and placing of contacts 843 and conductive material 845 in a similar milliner to that which has already been described.

Figure 9A:
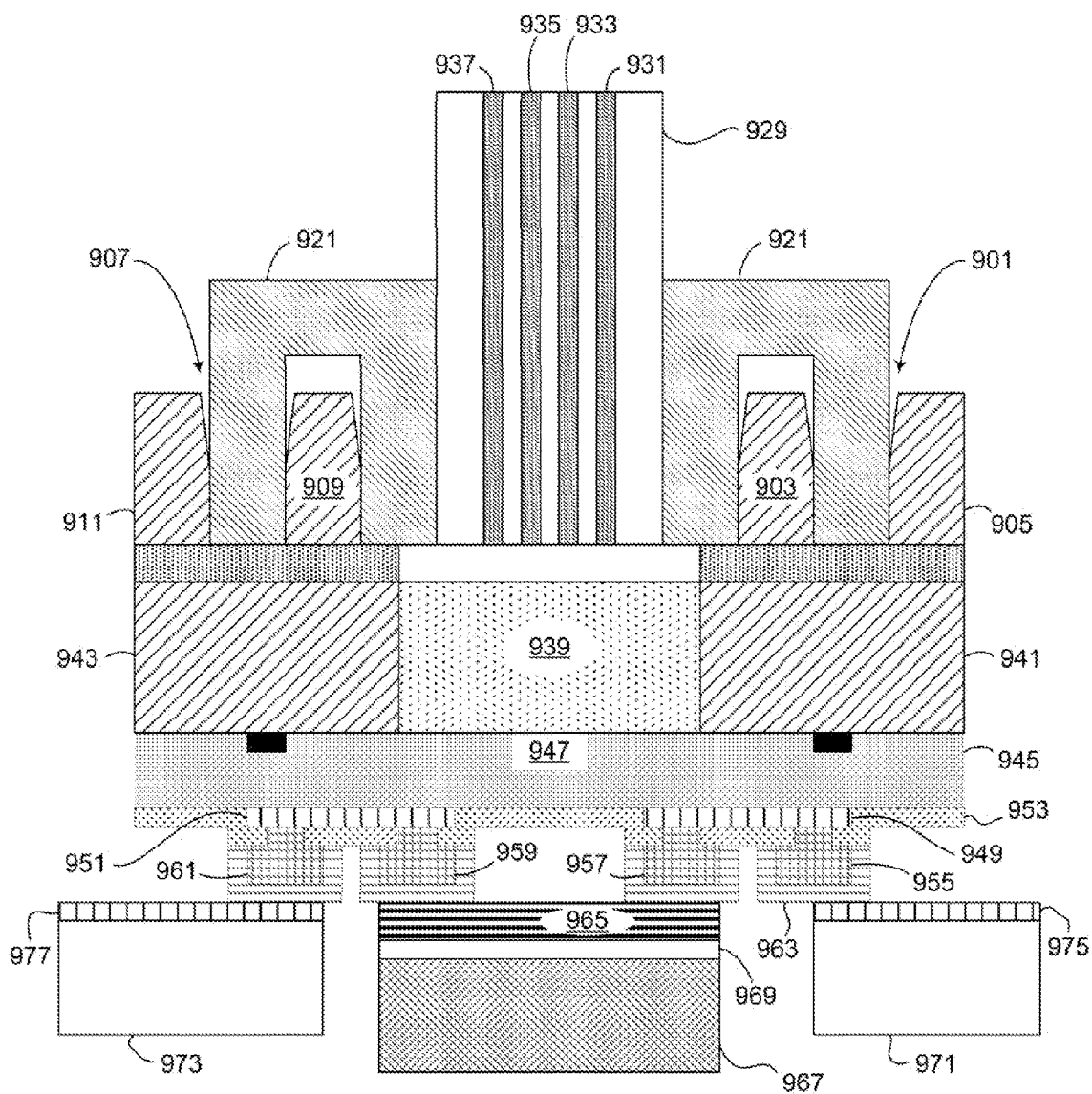
FIG. 9A is a sectional view of a glass-silicon wafer-stacked opto-electronic platform according to an example.
Figure 9B:
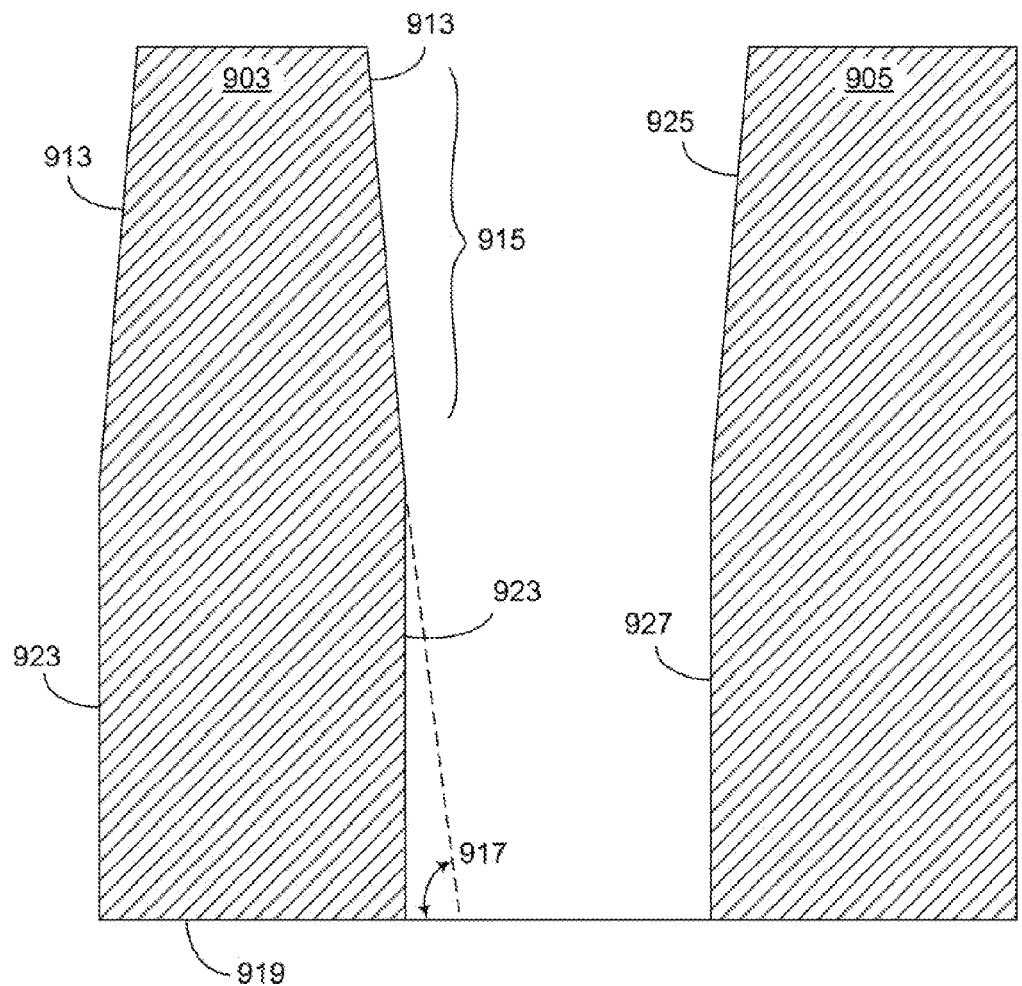
FIG. 9B is a detail ala portion of FIG. 9A.

FIG. 9A illustrates an example of an optoelectronic engine. A receptacle 901 is defined between a pillar 903 and a wall 905. A receptacle 907 is defined between a pillar 909 and a wall 911. The walls 905 and 911 may be separate structures or may be parts of a single wall structure that surrounds the receptacles 901 and 907. As best shown in FIG. 9B, in some examples the pillar 903 is formed with a sloping surface 913 at a distal end 915 of the pillar, the sloping surface 913 forming an acute angle 917 with a base 919 of the pillar, to facilitate insertion of a ferrule 921 into the receptacle 901, and a vertical surface 923 to facilitate angular and lateral alignment of the ferrule 921 in the receptacle 901. Similarly, the wall 905 is formed with a sloping surface 925 to facilitate insertion of the ferrule and a vertical surface 927 to facilitate angular and lateral alignment of the ferrule. The pillar 909 and wall 911 may be formed in a similar manner. The ferrule 9921 carries an optical fiber cable 929 that includes a plurality of optical fibers 931, 933, 935, and 937. The optical fiber cable 929 ends at an aperture 939 defined between supports 941 and 943. A glass wafer 945 is bonded to the supports with an array of microlenses 947 in alignment with the array of optical fibers. A surface of the glass wafer opposite the lens has conductive material defining conductors 949 and 951 covered with a silicon nitride layer 953. Contacts 955 and 957 are in electrical communication with the conductor 949, and contacts 959 and 961 are in electrical communication with the conductor 951. The contacts may be covered with material 963, for example solder. A component, for example a VCSEL die 965, is in electrical communication with the conductors 949 and 951 through the contacts 957 and 959, respectively. The die 965 may be attached, for example, by soldering. The VCSEL may be thermally connected to a heat sink 967 by thermally-conductive material 969. Other devices, such as a punted circuit board 971 and as flexible cable 973, may be connected to other contacts such as the contacts 955 and 961 through conductors 975 and 977, respectively. The thicknesses of the supports, etch stop layers, glass wafer, conductors, and contacts, and the microlens design, are selected for optimal coupling between the optoelectronic die and fiber cable.

FIG. 10 shows a top view of a glass-silicon wafer-stacked opto-electronic platform generally 1001 according to an example, with cross-sections A-A and B-B. In this example, a receptacle is defined by a silicon enclosure 1003 and silicon pillars 1005 and 1007. A plurality 1009 of microlenses is disposed between the pillars.

Glass-silicon wafer-stacked opto-electronic platforms embodying principles of the invention exploit batch fabrication, eliminating any need for MT ferrule guide pins and for active alignment of fiber with opto-electronic components, greatly reducing cost of manufacture without compromising quality.

We claim:

1. A glass-silicon wafer stacked platform comprising:
a plurality of silicon pillars defining a ferrule receptacle;
a silicon spacer connected to bases of the pillars and enclosing an aperture;
a glass wafer bonded to the spacer;
a microlens array formed in a first surface of the glass wafer and located in the aperture;
conductive material carried by a second surface of the glass wafer; and
contacts in electrical communication with the conductive material.

2. The platform of claim 1 and further comprising an etch stop layer between the pillars and the spacer.

3. The platform of claim 1 wherein at least one of the pillars has a sloping sidewall that defines an acute angle with respect to the base of that pillar.

4. The platform of claim 1 and further comprising a wall at least partially enclosing the ferrule receptacle.

5. The platform of claim 4 wherein the wall and the pillars are shaped to define a cavity that is relatively narrow adjacent the bases of the pillars and relatively wide adjacent a distal end of the pillars.

6. The platform of claim 1 and further comprising an opto-electronic die attached to at least one of the contacts and in optical communication with the microlens and aligned for optical communication with an optical transmission medium attached to the ferrule receptacle.

7. The platform of claim 1 and further comprising a light-transmissive material in the aperture.

8. A method of fabricating a glass-silicon wafer stacked platform, the method comprising:
etching a receptacle wafer of a silicon wafer assembly to form as plurality of pillars that define a ferrule receptacle;
etching a support wafer of the silicon wafer assembly to form a spacer and an aperture;
fabricating a microlens on as lens surface of a glass wafer;
depositing conductive material on a surface of the glass wafer opposite the lens surface;
bonding the lens surface of the glass water to the support wafer; and
depositing contacts on the conductive material.

9. The method of claim 8 wherein:
the silicon wafer assembly comprises an etch stop layer between the receptacle wafer and the support wafer; and
etching the support wafer comprises removing any etch stop from the aperture.

10. The method of claim 8 wherein etching the receptacle wafer to form the plurality of pillars comprises forming a sloping sidewall on at least one of the pillars, the sloping sidewall defining an acute angle with respect to a base of the pillar.

11. The method of claim 8 and further comprising:
covering the conductive material with an electrically insulating dielectric; and
forming openings in the electrically insulating dielectric to expose portions of the conductive material; and wherein:
depositing contacts on the conductive material comprises depositing the contacts through the openings in the dielectric.

12. The method of claim 8 and further comprising attaching an opto-electronic die to the contacts.

13. The method of claim 8 and further comprising depositing a light-transmissive material in the aperture.

14. The method of claim 8 wherein bonding the lens surface is performed after etching the support water.

15. The method of claim 8 wherein bonding the lens surface is performed prior to etching the support wafer.

* * * * *

UNITED STATES PATENT AND TRADEMARK OFFICE
CERTIFICATE OF CORRECTION

PATENT NO. : 9,164,249 B2  
APPLICATION NO. : 14/365129  
DATED : October 20, 2015  
INVENTOR(S) : Sagi Varghese Mathai et al.

Page 1 of 1

It is certified that error appears in the above-identified patent and that said Letters Patent is hereby corrected as shown below:

Claims

In column 8, line 9 approx., in Claim 8, delete "as" and insert -- a --, therefor.

In column 8, line 13 approx., in Claim 8, delete "as" and insert -- a --, therefor.

In column 8, line 16 approx., in Claim 8, delete "water" and insert -- wafer --, therefor.

In column 8, line 42 approx., in Claim 14, delete "water." and insert -- wafer. --, therefor.

Signed and Sealed this  
Fifteenth Day of March, 2016

Michelle K. Lee  
*Director of the United States Patent and Trademark Office*